United States Patent
Wright et al.

(10) Patent No.: US 7,209,838 B1
(45) Date of Patent: Apr. 24, 2007

(54) SYSTEM AND METHOD FOR ENERGY MONITORING AND MANAGEMENT USING A BACKPLANE

(75) Inventors: Kevin P. Wright, Fox Point, WI (US); Steven A. Lombardi, Waukesha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 459 days.

(21) Appl. No.: 10/673,753

(22) Filed: Sep. 29, 2003

(51) Int. Cl.
*G01R 21/00* (2006.01)

(52) U.S. Cl. .................. 702/60; 702/66; 700/291; 700/297

(58) Field of Classification Search .................. 702/57, 702/60–62, 64–66, 187, 188
See application file for complete search history.

(56) References Cited

U.S. PATENT DOCUMENTS

| | | | |
|---|---|---|---|
| 4,904,995 A | | 2/1990 | Bonner et al. |
| 5,576,700 A | * | 11/1996 | Davis et al. ................ 340/3.31 |
| 5,995,911 A | * | 11/1999 | Hart ............................ 702/64 |
| 6,094,622 A | * | 7/2000 | Hubbard et al. ............... 702/61 |
| 6,178,362 B1 | * | 1/2001 | Woolard et al. ............ 700/295 |
| 6,424,642 B1 | | 7/2002 | Schmidl |
| 6,738,692 B2 | * | 5/2004 | Schienbein et al. ......... 700/286 |
| 2001/0010032 A1 | * | 7/2001 | Ehlers et al. ................. 702/62 |
| 2002/0120521 A1 | * | 8/2002 | Forth et al. ................... 705/26 |
| 2002/0171541 A1 | | 11/2002 | Crombez et al. |
| 2003/0055677 A1 | | 3/2003 | Brown et al. |
| 2003/0187550 A1 | * | 10/2003 | Wilson et al. .............. 700/295 |
| 2004/0093124 A1 | | 5/2004 | Havlena |
| 2004/0119608 A1 | | 6/2004 | Rao et al. |
| 2004/0143420 A1 | | 7/2004 | Le Van Suv et al. |
| 2004/0150384 A1 | * | 8/2004 | Holle et al. ................. 324/110 |

* cited by examiner

*Primary Examiner*—Manuel L. Barbee
(74) *Attorney, Agent, or Firm*—Amin Turocy & Calvin LLP; William R. Walbrun

(57) ABSTRACT

An energy monitoring and management system and method are provided herein. The system and method centralize load metering by utilizing at least one sensor for observing load characteristics (e.g., Volts, Amperes, Watts, active energy . . . ) communicatively coupled via a backplane to a waveform analyzer component of a control component. The waveform analyzer component generates metered data values after receiving input from the at least one sensor. Subsequently and if so desired, the control component can send a control signal to the load to alter the state of the load or simply reduce the power to a load. Such input, output, and processing functionality, according to an aspect of the present invention, are employed using a backplane to facilitate high-speed communication among components and to allow metered data to be centrally stored, manipulated, analyzed or communicated to other components or subcomponents.

15 Claims, 15 Drawing Sheets

SYSTEM AND METHOD FOR ENERGY MONITORING AND MANAGEMENT USING A BACKPLANE

TECHNICAL FIELD

The present invention relates generally to electrical systems and machines, and more particularly toward a system and method of monitoring and managing energy utilization.

BACKGROUND

Deregulation has presented businesses with new and complex issues with respect to purchasing and managing energy. Utility companies provide a bundle of services including generation, distribution, and transmission. Deregulation has unbundled these services and allowed consumers to chose among a multitude of competing electrical generation suppliers while the local company continues to handle the distribution and transmission of power directly to the consumer. Competition is advantageous for consumers in that they are able to purchase cheaper energy, however competition among generation suppliers produces differing and often-complex pricing schemes. Although time varying billing rates existed for industrial consumers prior to deregulation, the billing was quite straightforward. In particular, industrial consumers would simply pay a single bill per period, normally each month, according to their total energy usage (kW-hr). Today, however, billing is quite a bit more complicated for industrial as well as residential consumers. In addition to having to separately pay a generation supplier and a local distributor, energy prices vary with the time of use (e.g., weekday, weekend, day, night, hour-of-the-day). Stated differently and simply, energy consumption at peak times (i.e., high demand) costs consumers more than during non-peak hours (i.e., lower demand). On-peak versus off-peak billing enables energy suppliers to contract with consumers concerning the power that they will make available at certain times and the price charged. This allows consumers to make cost effective decisions relating the use of power and allows the utility companies to prevent brownouts or blackouts due to over consumption.

The competitive global economy as well as various energy conservation movements have forced companies to operate and conduct business in an ever increasingly efficient manner. Accordingly, businesses must determine when and how to operate in a more cost efficient way with respect to the use of energy. Unfortunately, the growth and ubiquity of electrical systems and machines makes energy management a large and increasingly complicated task. For instance, many industrial processes and machines are controlled and/or powered by electric systems. Such processes and machines include pumps providing fluid transport for chemical and other processes, fans, conveyor systems, compressors, gear boxes, motion control devices, screw pumps, and mixers, as well as hydraulic and pneumatic machines driven by motors. Such motors combine with other system components, such as valves, pumps, furnaces, heaters, chillers, conveyor rollers, fans, compressors, gearboxes, and the like, as well as with appropriate motor drives to form industrial machines and actuators. For example, an electric motor could be combined with a motor drive providing variable electrical power to the motor, as well as with a pump, whereby the motor rotates the pump shaft to create a controllable pumping system. Demand can therefore vary immensely depending on which machines are running and in the case of variable speed motors at what speed they are running (e.g., 30% of max, 80% of max). Furthermore, electrical consumers, such as industrial facility operators in particular, normally have contracts with energy suppliers that specify a maximum amount of energy to be used per period of time and any amount of energy usage over that amount is penalized by charging an increased fee. Still furthermore, companies can set maximum usage levels at certain times to try and take advantage of contracted price schedules. Thus, there is a need for a system for controlling loads based on metered demand to ensure that energy demand does not exceed optimum limits in an operation.

Referring initially to FIG. 1 a conventional load monitoring and management system 100 is depicted. The system 100 includes, a master controller unit 110 and a plurality of self contained localized power monitors 120 (POWER MONITOR$_1$ through POWER MONITOR$_N$, where N is an integer greater than one) associated with a multitude of loads 130 (LOAD$_1$ through LOAD$_N$, where N is an integer greater than one). Each power monitor 120, as depicted, contains a processor, a power supply and a network communications component. Conventionally, loads are metered or monitored by a power monitor 120 associated with each load 130. The collected data can then be sent to the master controller 110 (e.g., via pulsed communication), which can subsequently control the load based upon some type of optimization scheme. Additionally, in some conventional systems the power monitors 120 include output relays that provide a degree of local load control. It should be understood that conventional systems such as system 100, described supra, teach utilizing separate self contained power monitors communicatively linked to a master controller to monitor and manage energy. Such an approach is not the best approach at least because it is very expensive to provide a separate power monitor unit for capturing and managing energy data for each load.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

In accordance with the present invention, a system and method for centrally monitoring and managing loads is disclosed. The system and method centralize load metering by utilizing at least one sensor for observing load characteristics (e.g., Volts, Amperes, Watts, active energy . . . ) communicatively coupled via a backplane to a control module. The control module can contain, inter alia, a waveform analyzer component, which can produce metered energy data values (e.g., total energy consumed, harmonic distortion, power factor) from sensor data. More specifically, the waveform analyzer component captures input data from sensors (e.g., Volts, Amperes, Watts) associated with a load, time stamps the data as it is received, and stores a sequence of events (SOE) in a memory. The waveform analyzer can subsequently use the SOE to calculate energy data. Thereafter and if so desired, the waveform analyzer component, in cooperation with the other control module components (e.g., processing component, input/output modules), can control the power distributed to at least one load based in part on the generated energy data. It should be noted that such input, output, and processing functionality, according to an aspect of the present invention, are employed utilizing a backplane to facilitate high-speed communication among components and to allow metered data to be centrally stored, manipulated, analyzed or communicated to other components or sub-components.

The subject invention as disclosed herein enjoys many advantages and benefits over conventional systems including but not limited to increased speed and performance as well as reduced cost. The present invention is much faster than conventional systems. By limiting the sensed data to only a few basic parameters (e.g., Volts, Amperes, Watts) and tying the sensed data directly to a backplane, the speed at which data can be processed by a processor component is drastically increased. One reason for the increased speed is the processing power available to a backplane device is much higher than for a remotely located power monitor unit. Furthermore, the subject invention reduces cost by eliminating a multitude of independent and self-contained power monitors in favor of a centralized load control system performed utilizing a backplane. Additionally, by monitoring energy utilizing a backplane in a PLC (Programmable Logic Controller) or SLC (Small Logic Controller), for example, such data can be easily accessed and employed as a decision parameter in automated systems. Still further yet, implementing metering functionality on a removable circuit board (e.g., PLC/SLC card or module) enables such metering functionality to be added and/or removed from an automated system with little or no negative impact on the current operations.

To the accomplishment of the foregoing and related ends, certain illustrative aspects of the invention are described herein in connection with the following description and the annexed drawings. These aspects are indicative of various ways in which the invention may be practiced, all of which are intended to be covered by the present invention. Other advantages and novel features of the invention may become apparent from the following detailed description of the invention when considered in conjunction with the drawings.

BRIEF DESCRIPTION OF THE DRAWINGS

The foregoing and other aspects of the invention will become apparent from the following detailed description and the appended drawings described in brief hereinafter.

DETAILED DESCRIPTION

The present invention is now described with reference to the annexed drawings, wherein like numerals refer to like elements throughout. It should be understood, however, that the drawings and detailed description thereto are not intended to limit the invention to the particular form disclosed. Rather, the intention is to cover all modifications, equivalents, and alternatives falling within the spirit and scope of the present invention.

As used in this application, the terms "component" and "system" are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

Furthermore, the present invention may be implemented as a method, apparatus, or article of manufacture using standard programming and/or engineering techniques to produce software, firmware, hardware, or any combination thereof. The term "article of manufacture" (or alternatively, "computer program product") as used herein is intended to encompass a computer program accessible from any computer-readable device, carrier, or media. Of course, those skilled in the art will recognize many modifications may be made to this configuration without departing from the scope or spirit of the subject invention.

Figure 1:
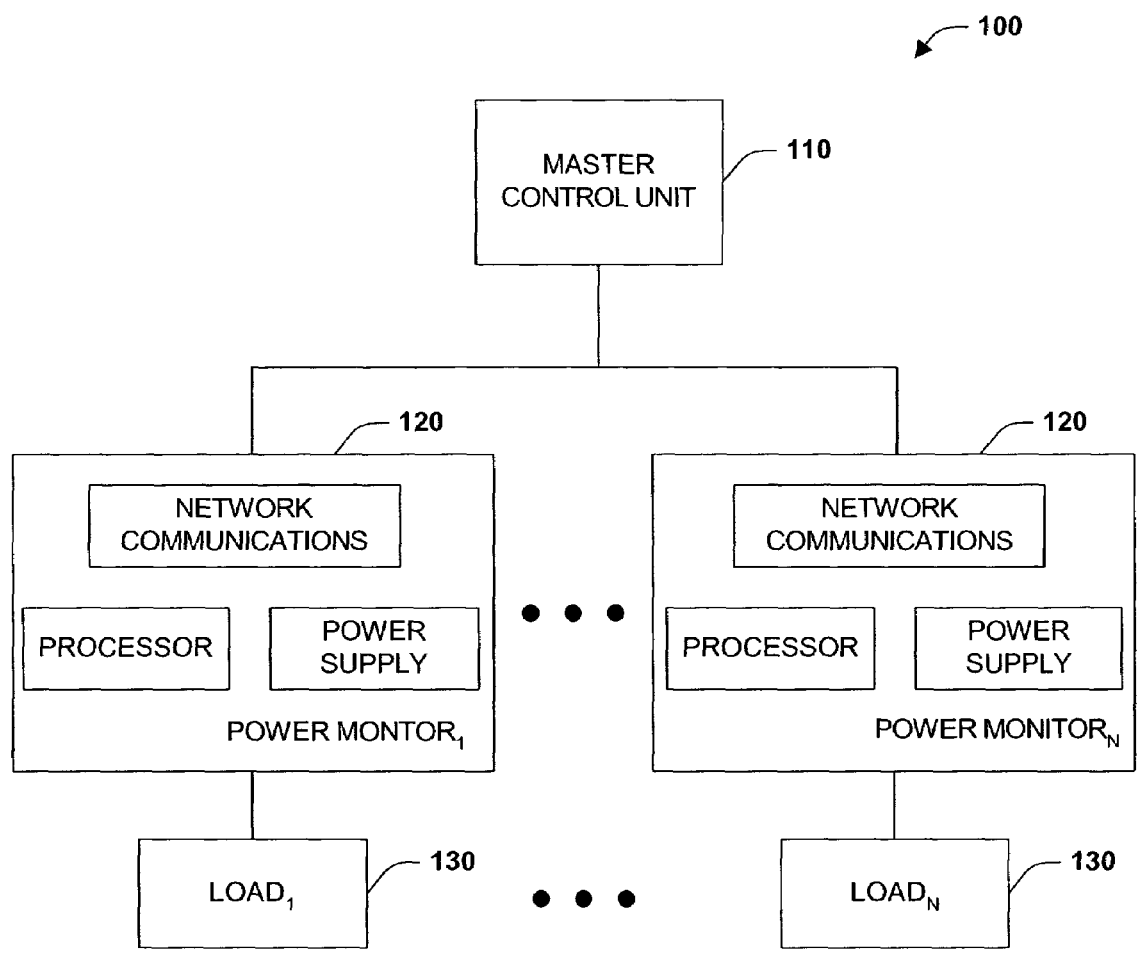
FIG. 1 is a block diagram of a conventional central load control system in accordance with the prior art.
Figure 2:
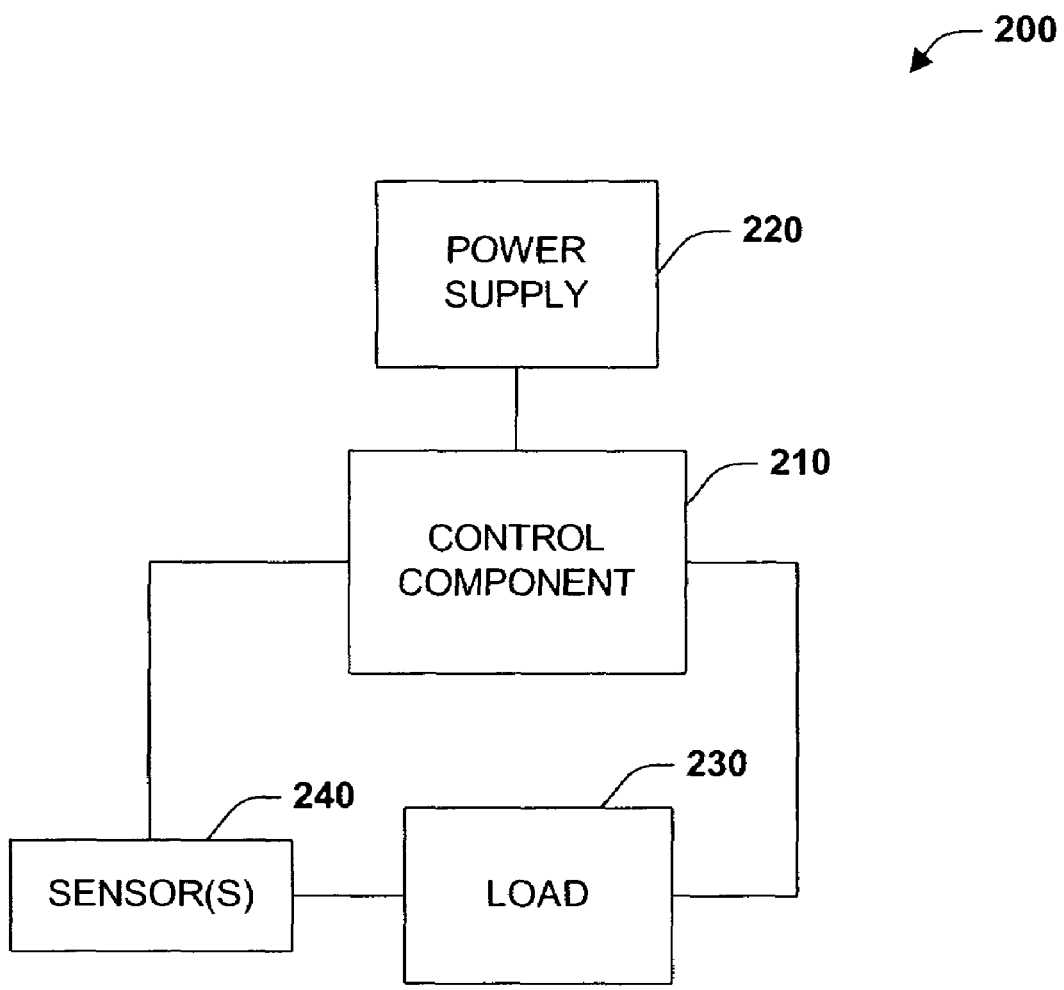
FIG. 2 illustrates a load control system in accordance with an aspect of the present invention.

Turning to FIG. 2, a load monitoring and control system 200 is illustrated in accordance with an aspect of the present invention. System 200 comprises a control component 210, power supply 220, load 230, and sensor(s) 240. Control component 210 is coupled to power supply 220 and regulates the rate of energy utilized by a load 230. A load 230, as used herein, can be defined as any device or machine that dissipates and/or stores energy (e.g., pumps, furnaces, fans, air conditions, belt motors, air and water filtration systems, condensers . . . ). Thus, it is to be appreciated that this invention can have industrial, civil, residential, and/or military applications. Sensor(s) 240 capture a plethora of information about an associated load (e.g. Volts, Amperes, Watts) and thereafter communicate such findings to the control component 210 which processes and determines the power allotment for a specific load 230 based at least in part on the sensed data and a load optimization algorithm. Sensor(s) 240 can be external to load 230 and/or integrated into the load 230. Furthermore, the sensor(s) 240 can be the same sensors utilized for other functions, for instance sensors used for machine diagnostics. Accordingly, one of the advantages of the present invention is that it can leverage an existing system to provide additional functionality and improved system performance. Additionally, system 200 illustrates a configuration in which the control component 210 is coupled to the power supply 210 such that the control component 210 distributes power to the load 230. However, the present invention embraces various other configurations such as where a power supply is coupled to a load 230 and the control component 210 outputs a signal indicative of the amount of power to be provided to load 230 to another local controller (not shown) associated with the load which thereafter regulates the power distributed to the load.

Figure 3:
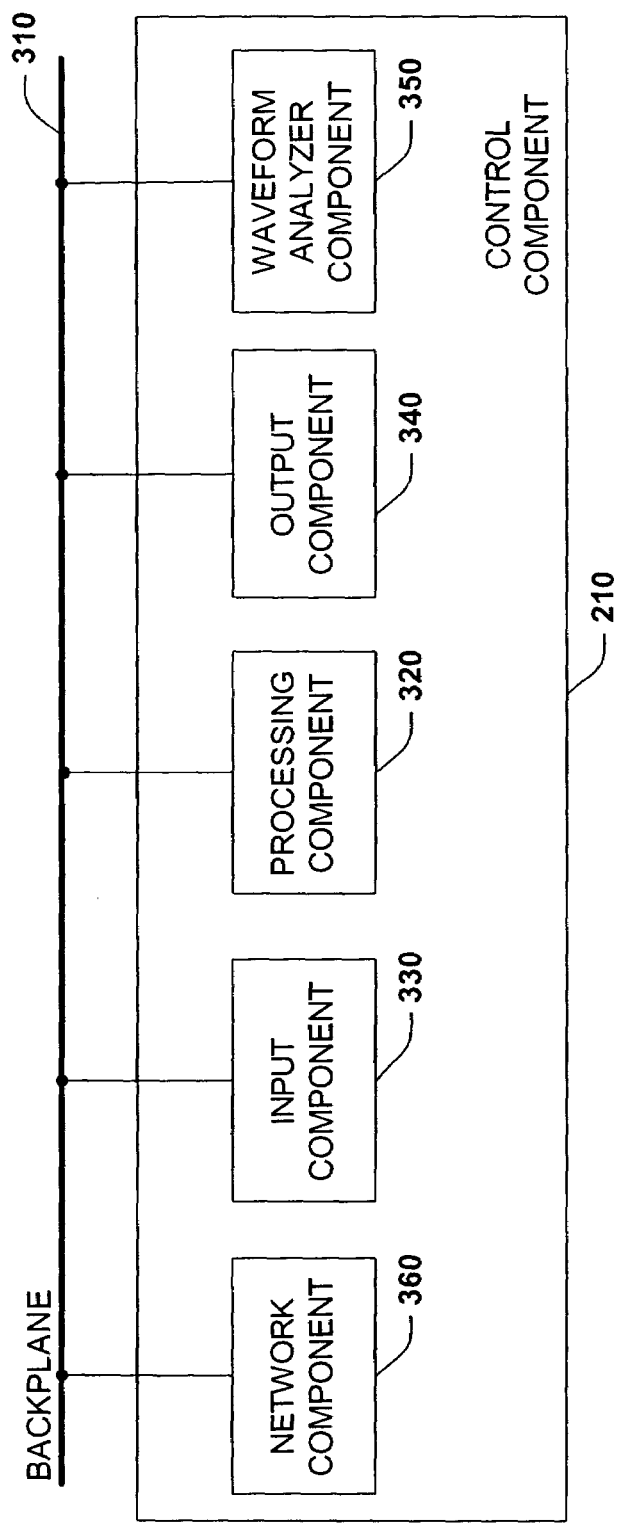
FIG. 3 is a block diagram depicting a control component in accordance with an aspect of the present invention.

FIG. 3 is a high-level block diagram depicting a control component 210 in accordance with an aspect of the subject invention. Control component 210 includes processing component 320, input component 330, output component 340, wave form analyzer component 350, and network component 360. Processing component 320 can include one or more high performance computer processors for processing input data from input component 330 and controlling output values via output component 340. Processing component 320 can also contain memory (e.g., 750K, 1.5M, 3.5M, 7.5 M bytes . . . ) for storing programs and variables necessary for program execution (e.g., determining metered data). Input component 330 receives data from a multitude of different sources and makes the collected data available to the control component 210 for processing. Input 330 can, in some situations, convert input signals to backplane plane signals to facilitate high-speed component-to-component communication. One source of data that can be collected by input component 330 can be from sensor(s) 240 (FIG. 2). Output component 340 distributes the results of the processed inputs to various components connected thereto. For example, output component 340 can distribute an appropriate amount of power (AC or DC) to a load 230 (FIG. 2). Alternatively, output component 340 can be a signal communicated to another component indicative of the desired result of the processed inputs. Furthermore, it should be appreciated that although both input component 330 and output component 340 are shown as separate components, they can be integrated together into a signal input/output component. Waveform analyzer component 350 receives data from sensors 240 (FIG. 2) via input component 330 and calculates power, energy, or metered data (used herein interchangeably) such as but not limited to energy consumption, power factor, and harmonic distortion. Computed power data can then be utilized by the processing component 320 in determining the output of an optimization algorithm. Control component 210 can also include a network component 360 for communicating with various other components over a network (described in further detail infra). Network communication according to an aspect of the invention can be carried out either via wire (e.g., twisted pair, coaxial cable, optical fiber) or wirelessly (e.g., using IEEE 802.11a and/or IEEE 802.11b standards, Bluetooth technology, satellite). Finally it should be noted that communications between all control component components are via backplane 310. Backplane 310 is a physical data communication medium. Backplane 310 facilitates high-speed communication and data exchange between connected components. The high rate of data exchange is enabled by the backplane 310 at least because the backplane has a very large bandwidth and because of the physical proximity of the components (i.e., very close together thus limiting the distance data must travel). Finally, it should be noted that various other components can be connected to the backplane 310 from inside or outside the control component 210 including but not limited to a power supply, microprocessors, embedded web pages, measurement technology, and other input/output devices.

Figure 4:
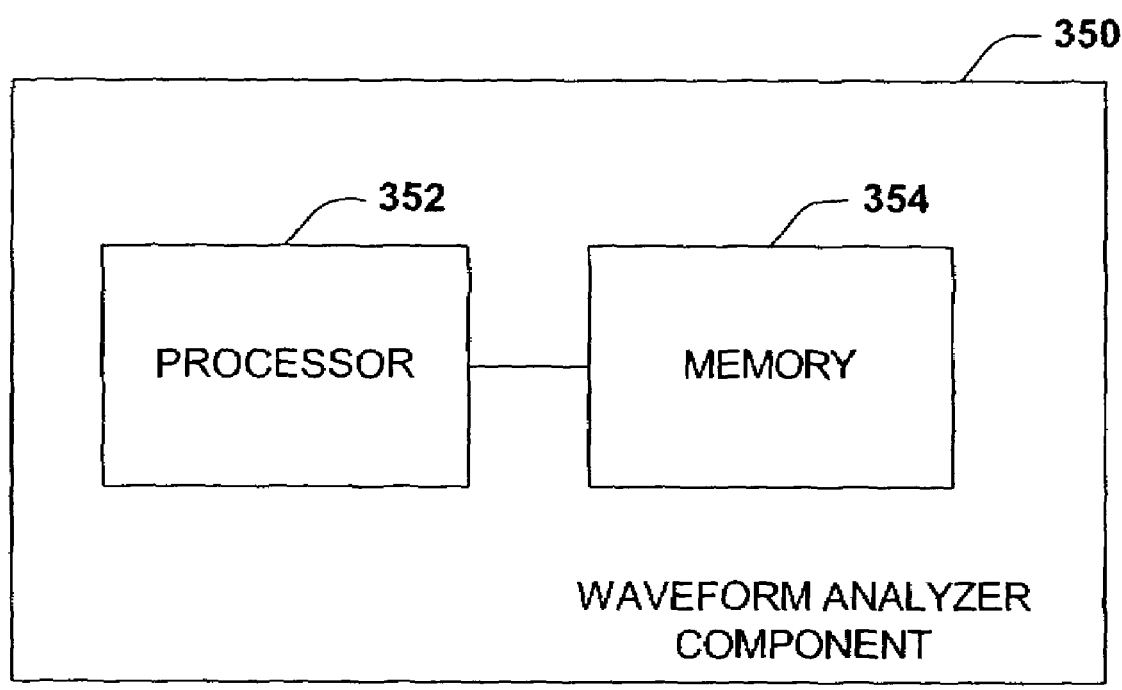
FIG. 4 is a block diagram of a waveform analyzer component in accordance with an aspect of the present invention.

FIG. 4 depicts a waveform analyzer component 350 in accordance with an aspect of the present invention. Waveform analyzer component 350 facilitates, inter alia, monitoring and management of electric power. Monitoring and managing power can help among other things reduce power costs and extend the life of power consuming devices. Waveform analyzer component 350 comprises a processor 352 and memory 354. Processor 352 can be any available microprocessor(s) that enables processor 352 to retrieve, transmit, and analyze data. During operation, processor 352 runs algorithms or programs on captured sensor data. As data is received, the processor can time stamp the data to indicate when the data was captured. The processor can also cooperate with memory 354 not only to facilitate program execution but also to create a sequence of events (SOE) and store the SOE in memory 354 (e.g., as a table, list, or other data structure). The processor 352 can then utilize the SOE to produce power data (also referred to herein as metered data and energy data) including but not limited to the amount of energy consumed, harmonic distortion, and power factor. The power data can subsequently be provided to a processing component 320 (FIG. 3) running a load optimization algorithm, for example. Furthermore, it should be noted that the waveform analyzer component 350 can be employed on a removable circuit board or card. Thus waveform analyzer functionality can be added to an existing control system by simply connecting the card to a vacant backplane connector. This enables a system to be equipped with or stripped of waveform analyzer functionality with little or no interference with the operation or configuration of the existing system.

Figure 5:
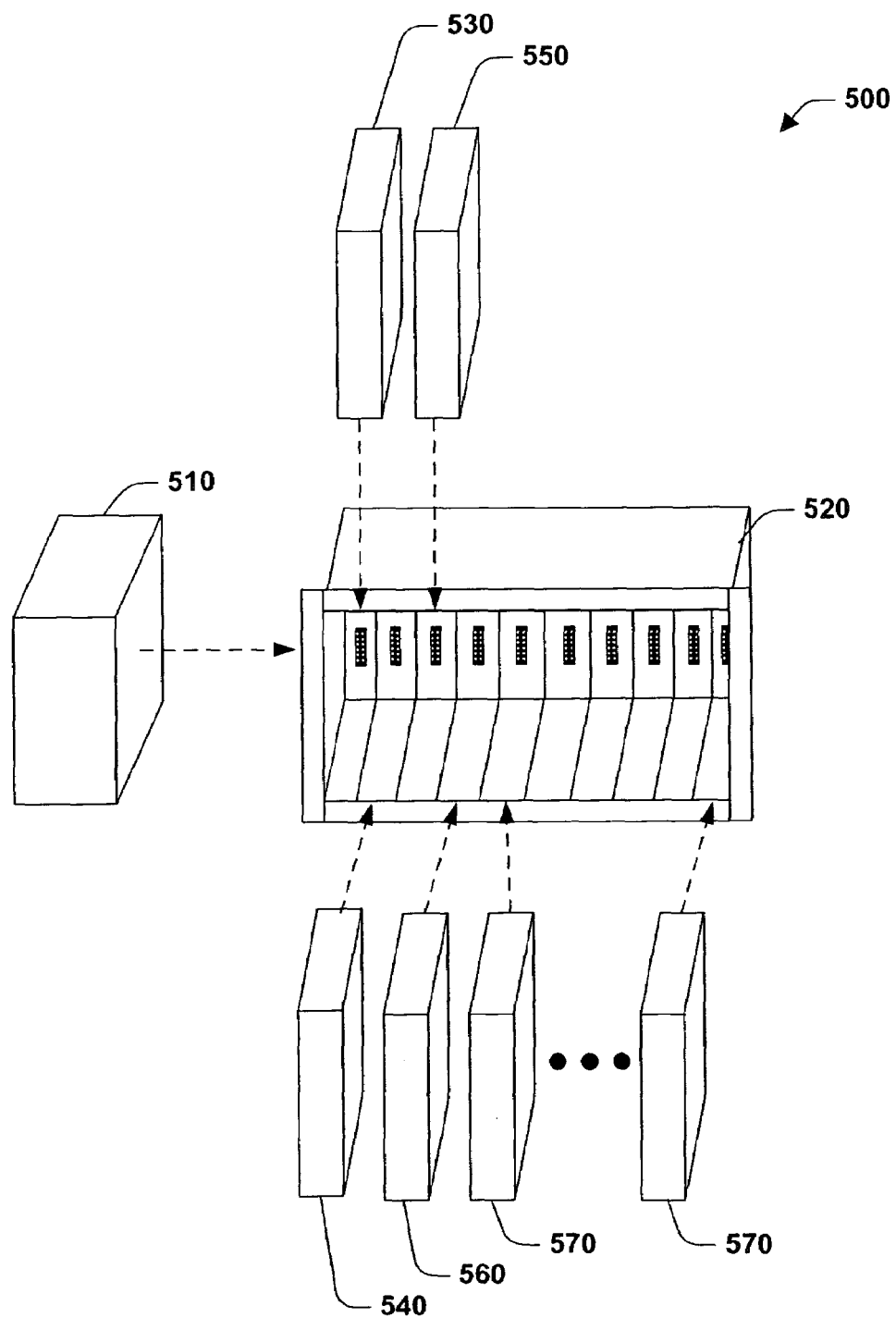
FIG. 5 illustrates an exemplary system operating environment in accordance with an aspect of the present invention.

FIG. 5 depicts an exemplary operating environment for the presently described system. The operating environment consists of a programmable logic controller (PLC) (or alternatively SLC (Small Logic Controller)) 500. PLC 500 comprises a power supply 510, a backplane chassis 520, a processor component 530, a network component 540, an adapter component 550, a waveform analyzer component 560, and a plurality of input/output components 570. Power supply 510 provides power to various loads connected to the PLC, the quantity and rate of power distribution being controlled by processor component 530. Power supply 510 can stand alone or be mounted within the backplane chassis 520. Processor component 530 processes input values and controls the output. Processor component 530 can also communicate with other components in the chassis across the backplane. The backplane chassis 520 houses and facilitates communication between housed components or modules. Although processor component 530 can have built in communication ports, there is often a network component 540. Network component 540 facilitates, inter alia, network communication to computers, other PLC processors, and I/O components in remote locations (described in further detail infra). PLC 500 can also include an adapter component to link the backplane to a processor at another location. Moreover, PLC 500 can include a waveform analyzer component 560 to enable monitoring and management of electric power. Finally, a plurality of input/output components 570 can be employed to convert input signals to backplane signals and backplane signals to output circuit signals. In addition, it should be noted that waveform analyzer component 560 does not need to be an additional PLC module as illustrated. The waveform analyzer component can also be placed into a processor component backplane slot or integrated into the processor component or module of a PLC device. Also, it should be appreciated that by providing waveform analyzer functionality on a PLC based card or in a separate PLC module, the functionality can easily be added to an existing PLC system. Thus, the existing base of microprocessor based backplane devices can be leveraged to provide power monitoring and management. It should also be appreciated that PLC 500 is a general PLC device and the subject invention covers implementation of a power management component in PLCs, SLCs, and the like of varying size and functionality.

Figure 6:
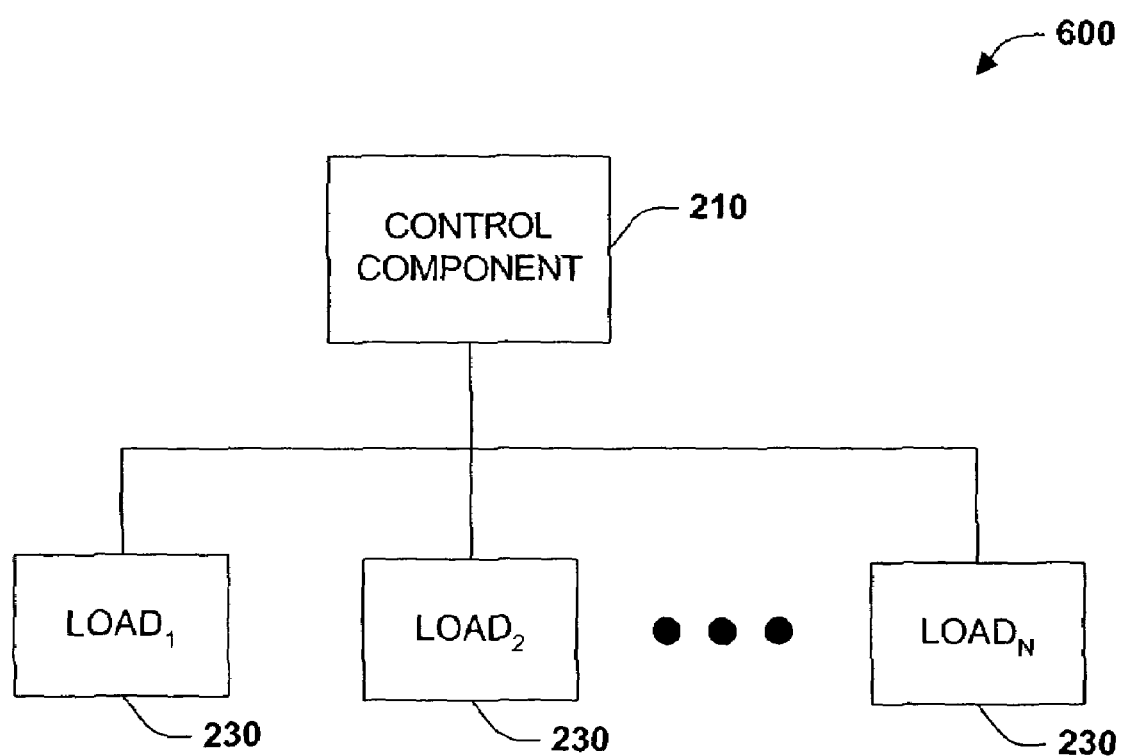
FIG. 6 depicts a high-level block diagram of a system in accordance with an aspect of the subject invention.

Turning to FIG. 6, another system 600 is illustrated in accordance with the present invention. Up to this point the subject invention has be described primarily with respect to controlling a single load, however the scope of the invention is much broader. System 600 includes a single control component 210 and a multitude of loads 230 ($LOAD_1$ through $LOAD_N$, N being an integer greater than one). Accordingly, it should be appreciated that a single control component 210 can provide power management and monitoring for a single load 230 or alternatively for a plurality of loads 230. This is advantageous because conventionally self contained power monitors are associated with each and every load. Providing central load control and power management reduces cost by eliminating power monitors. Additionally, control and power monitoring via the waveform analyzer can be applied in a distributed environment.

Hereinafter, the load management aspect of the subject invention will be described with respect to a distributed system of control components 210. It is to be appreciated that each control component 210 can employ the same techniques as described with respect to a plurality of components. In particular, control component 210 can employ load optimization algorithms that account for business objectives, machine or load health, as well as power data as generated in the manner previously discussed utilizing a waveform analyzer component 350, sensor(s) 240, and a backplane 310.

Figure 7:
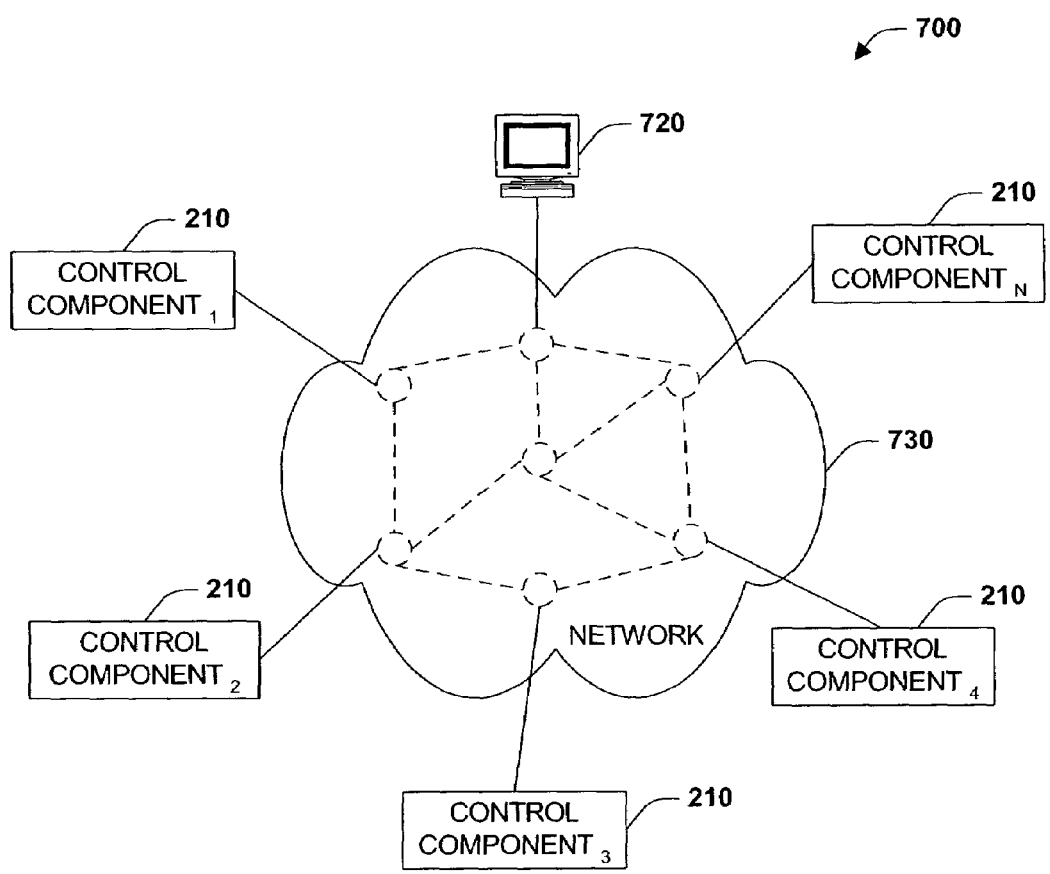
FIG. 7 is a schematic diagram of a system in accordance with an aspect of the present invention.

Turning to FIG. 7, a load monitoring and management system 700 is illustrated in accordance with an aspect of the present invention. System 700 comprises a plurality of control components 210 ($CONTROL\ COMPONENT_1$ through $CONTROL\ COMPONENT_N$, N being an integer greater than one), information input component 720, and network 730. As described supra, control components 210 can regulate the rate of energy utilized by a load. A load as used herein can be defined as any device or machine that dissipates and/or stores energy (e.g., pumps, furnaces, fans, air conditions, belt motors, condensers . . . ). Informational input component 720 facilitates distribution of information relating to how loads should be managed to control components 210. Such information relating to loads can be generated by a computer, input by an operator, or a combination thereof. Furthermore, it should be noted that informational component 720 can be a host computer for providing services such as computation and network control for the control components 210, as described in further detail hereinafter. At least a subset of control components 210 are connected to each other as well as other components such as the information input component 720 via network 730. Furthermore, since the control components are connected by way of a network the entire system of loads and control components is scalable. Scalability is important because it ensures that the system is easily adapted to changed circumstances. In a conventional master slave load control configuration, the breadth of slave devices is needed to be known when the master is selected. According to the present invention, any number of peer devices (e.g., load controllers, computers . . . ) may be easily added to the network at any time. Additionally, it should be appreciated that control components 210 and other components can be connected to network 730 either via wire (e.g., twisted pair, coaxial cable, optical fiber) or wirelessly (e.g., using IEEE 802.11a and/or IEEE 802.11b standards, Bluetooth technology, satellites).

Network 730 encompasses communication networks such as local area networks (LANs), metropolitan area networks (MANs), or wide area networks (WANs). LANs are peer-to-peer networks that are optimized for moderated size geographic area which enable communications between networked devices via a single physical medium. LANs are normally owned and used by a single individual or organization. MANs are networks that are optimized for geographical areas larger than those covered by a LAN but smaller than those covered by a WAN. In particular, a MAN provides a means of communications ranging from several blocks (e.g. a university campus) to an entire city. MANs may be owned and operated by a single individual or organization, but are generally utilized by many different individuals and organizations. WANs are communication networks that span a large geographic area (e.g., nationwide, worldwide) and generally consist of the several interconnected LANs and MANs. The largest known WAN known today is the Internet. LAN technologies include Fiber Distributed Data Interface (FDDI), Copper Distributed Data Interface (CDDI), Ethernet/IEEE 1102.3, Token Ring/IEEE 1102.5, physical connection topologies such as bus, tree, ring, and star, and the like. WAN technologies include, but are not limited to, point-to-point links, circuit switching networks like Integrated Services Digital Networks (ISDN) and variations thereon, packet switching networks, T1 networks, and Digital Subscriber Lines (DSL).

Organizing a load management system in the manner illustrated by system 700 has many beneficial aspects. Most importantly, none of the control components 210 are clearly the master controller. Rather, a plurality of control components 210 collaborate to provide master control functionality at a finer granularity. Additionally, the present invention further reduces costs because there is no need for a physical master controller. Furthermore, the subject invention is easier to use because it is highly scalable—any number of devices or components can be added to the network at any time without difficultly. Accordingly to one aspect of the subject invention, control components 210 and other components are designed to take advantage of plug-and-play (PnP) technology or universal plug-and-play (UPNP) technology, where newly added components are immediately recognized by other members of the network and configure themselves to operate with other networked components.

Figure 8:
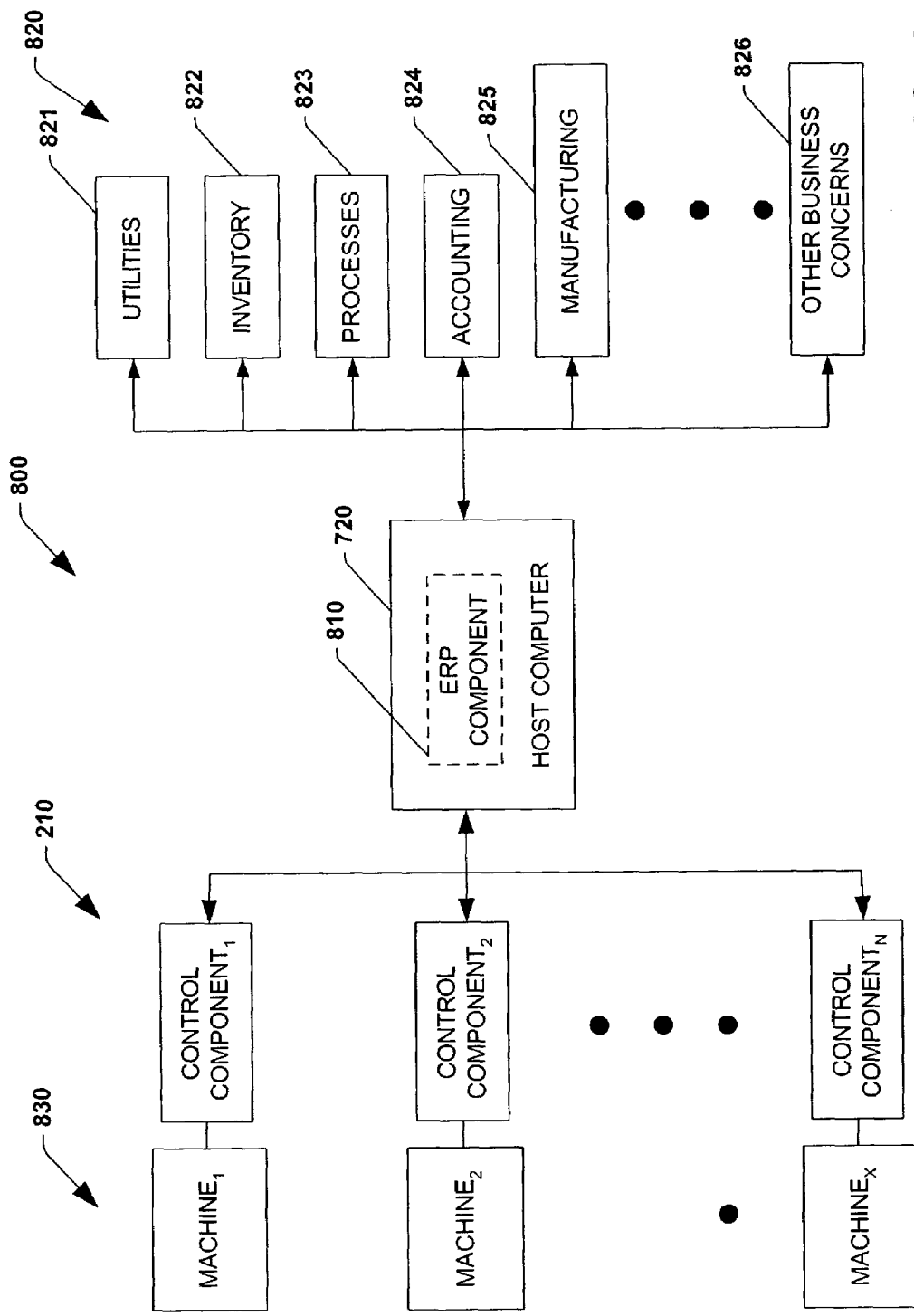
FIG. 8 is a schematic block diagram of system in accordance with an aspect of the present invention.

FIG. 8 is a schematic block diagram of a one particular system 800 in connection with the subject invention. System 800 comprises machines 830 ($MACHINE_1$ through $MACHINE_X$, X beginning an integer greater than one), and control components 210 ($CONTROL\ COMPONENT_1$ through $CONTROL\ COMPONENT_N$, N being an integer greater than one). Machines 830 encompass any device that dissipates and/or stores electrical energy (e.g., pumps, furnaces, fans, air conditions, belt motors, condensers . . . ). Machines 830 are associated with control components 210 ($CONTROL\ COMPONENT_1$ through $CONTROL\ COMPONENT_N$, N being an integer greater than one), which regulate energy to each associated machine based on collected or generated data relating to the current and/or predicted operating state of a system. It is to be appreciated that the plurality of machines 830 can share and cooperative via control components 210; and it is to be appreciated that the machines 830 do not have to be the same make, model, or type of machine. Each machine 830 can have its own associated control component 210, as shown. Alternatively, it should be noted that a single control component 210 can be employed to operate more than one machine 830 (as previously described). Various other configurations may be possible and may become apparent to those of skill in the art upon reading this specification. Such varying configurations are intended to be covered by the present invention. Each control component 210 is aware of amount of power dissipated and/or stored (i.e., Watts, vars) by an associated machine during operation and regulates the amount of power provided to the device(s). Thus, a control component associated with a particular machine determines whether such machine will be "on" (e.g., provided required power) or "off" (e.g., no power provided, threshold operating voltage not provided) and/or in a reduced power mode (e.g., hibernate, slower motor speed). The host computer 720 includes an enterprise resource planning (ERP) component 810 that facilitates analyzing the load data associated with a machine and/or a set of machines, as well as data relating to the business concern components 820 (utilities component 821, inventory component 822, processes component 823, accounting component 824 manufacturing component 825 . . . ). The data is analyzed and the host computer 720 executes various optimization programs to identify configurations of the various components so as to converge more closely to a desired business objective. For example, assume a current business objective is to operate in a just in time (JIT) manner and reduce costs as well as satisfy customer demand. If the inventory component 822 indicates that finished goods inventory levels are above a desired level, the ERP component 810 might determine based on the data from the utility component 821 that it is more optimal given the current business objective to run machines at 60% rather than 90% which could further extend the life of some machine components and reduce power consumption. Furthermore, the ERP component 810 might determine based on additional data from the utility component 821 that the machines could be run during off-peak hours at 75% rather than 60% during peak hours thereby reducing the power consumption expense and completing the job faster. In another exemplary situation, assume a sale a marketing department secure and promised deliver goods to a purchaser by a certain date. Further assume that the control components 210, without any other data with respect to this promise, would reduce or perhaps completely shut down certain processes. The marketing department realizing or recognizing such a scenario could input data into a business concern component 826 corresponding to the promise to produce goods by a certain date to ensure that such promise is honored regardless of the additional power consumption costs associated with the production. Load control components 210 could subsequently retrieve or receive said data and implement a control scheme that would complete the goods on time.

Load control components 210 can also cooperate with each other to ensure that total plant energy consumptions stays below maximum levels contracted for with the utility company. According to one aspect of the invention, each load control component can continuously transmit its power consumption in real-time or at periodic intervals to the host computer. The host computer 720 can then calculate the total energy consumption being used by all the machines in the plant and notify the controllers when the total energy reaches a threshold value so that they can determine amongst themselves how to reduce the total power level. Additionally, control components 210 which desire to increase their power consumption can retrieve the total plant energy consumption value calculated and stored by host computer 720 to determine extent to which they can increase their power consumptions. According to another aspect of the present invention, each load control component 210 itself can be held responsible for communicating with all other load controllers to determine and thereafter store in local memory, for example, the total energy consumption of the plant. Load control components 210 can thereafter regulate load levels for a plurality of loads based on the derived total energy consumption of the facility or plant.

Control components 210 can also be employed to optimize power consumption in accordance with a billing schedule. A billing schedule corresponds to a rate structure for energy consumption based on time-of-use. Different rates can be charged according to, inter alia, the day of the week, whether it is a weekday or a weekend, time of the day, hour of the day, and even down to minutes and seconds of particular days. Load controllers 210 can be made aware of these schedules by retrieving them from a remote location (e.g., a power company web page, company database) or receiving them from the host computer 340 or an agent thereof. Load control components 210 can then communicate with other control components in a process, for example, to determine the optimum manner to complete a goal or task. For instance, assume 500 widgets need to be processed in the next 3 hours. Further assume that according to the billing schedule the first hour is during peak demand and the last two hours of the three hour period is off peak. Accordingly the control components associated with the processing of widgets could together determine an optimum production schedule or strategy by employing an optimization algorithm such that, for example, they operate at 60% power during the first peak demand hour and then increases the power to 85% during the off peak time to complete the 500 widgets within the allotted three hour time period. Furthermore, since communication can be in real-time, if after initiating the above described production schedule the control components 210 are notified or they determine that the total energy usage in a facility is approaching a threshold level (e.g., 95% of the maximum energy contracted for during the time period) the control component could reduce the widget processing power to 90% during that time and increase the power later, perhaps during the off-peak time, to make up the 5% decrease in power used to process the widgets. In another situation, the control components 210 may have to shut down lower priority machines and processes (described infra) in a facility for a period of time to ensure the widgets are processed on time.

It is to be appreciated that although load control components 210 can send, receive, and process information utilizing the central host computer 720, the ultimate decision of whether to reduce, cut off, or increase a load resides with individual load control component 210. The load control components 210 communicate and cooperate with each other to optimize energy consumption among those control components in a network. To facilitate said functionality, according to one aspect of the subject invention, control components 210 can be associated with a variable priority level (e.g., 1–10) according to their importance. Thus, a control component 210 associated with a high priority (e.g., 1) would be less likely to take energy conservation actions, such as reducing or cutting off power, than a load control component associated with a low priority (e.g., 10). In addition to each load control component being aware of the function of the machine it is associated with, load controllers 210 can be also be context aware. Control component priority levels can then be set according to the function of the machine associated with the each respective load control component and the current context of the machine. For instance, a load control component 210 associated with an air condition module in the plant at 3 a.m. would have a low priority (e.g., 10, whereas a belt drive motor in a currently running process would have a high priority (e.g., 1). Moreover, it should be appreciated that control component to control component communication as well as priority determinations occur in real-time. Thus, if an assembly line belt motor is shut down as an employee checks out a problem with a product on the line, this control component status can be cascaded down the assembly line such that the load control components can place their associated machines in a lower energy state to conserve power. Subsequently, when the belt motor is turned back on such information can be passed to control components down the line such that they can bring the power level of their machines up to an appropriate level. Allowing load control decisions to reside with the individual control components enables decisions to be made at a much finer level of granularity than is possible with a central master controller.

Furthermore, it should be appreciated that loads can be grouped into classes for purposes of control and assignment of priorities. It is often the case that machines 310 comprise several subcomponents or machines that are important to the successful operation of the larger machine. Furthermore, several machines 310 often cooperate with each other to achieve a common goal, such that shutting down a single machine or reducing power to a single machine would be impractical and even dangerous in some instances. For example, it would not be appropriate to shut down an electronic device's cooling fan while that device is currently operating. It would be equally inappropriate to reduce power and thus speed to a single belt drive motor while leaving contiguous belt drive motors at full power. To ensure that such problematic situations do not occur, loads can be organized into classes, such that reduction or termination of power to one load in a class will result in the same action being taken with respect to the remaining members of the class. Such classification can be done programmatically by an operator or alternatively load control component 210 can classify loads themselves by communicating information to each other regarding their function and context.

Altering or reducing a load associated with a variable speed machine has additional benefits beyond energy cost reduction. For example, review Table I below:

TABLE I

| Power Source/ Control Technique | Direct Line Power - Flow Control with Throttle Valve | Drive Power - Flow Control via Motor Speed |
| --- | --- | --- |
| Full Flow - Power Flow: 75 gpm (flow not restricted) | 1.07 kW | 1.13 kW |
| Reduced Flow - Power Flow: 45 gpm (restricted flow) | .881 kW | .413 kW |

The above data exhibits energy utilization from a motor pump system under conditions of full flow and reduce flow. The flow rates shown are achieved using a variable speed drive responsive to a load controller to control motor speed and therefore flow rate (Column 1) with a motor running directly from the power line with a throttling valve used to control flow rate (Column 2). The estimated energy savings with Drive Power at a reduce flow is 0.468 kW—a 53% energy savings in connection with Drive Power. Pumping applications which require operation at various prescribed head pressures, liquid levels, flow rates, or torque/speed values may be effectively controlled by varying the motor speed via controlling the energy distributed thereto. The benefits of varying the motor speed for pump applications, in particular, are well established, specifically with respect to pumps that do not operate at full rated flow all the time. Furthermore, the scope of benefits of reducing motor speed by way of reducing power is broad. Such benefits include improved machinery reliability, reduced component wear, and the potential elimination of various pipe-mounted components such as diverters and valves and inherent machinery protection such as from over-current or under-current.

It is also to be appreciated that the various machines 830 or business components 820 or a subset thereof can be located remotely from one another. The various machines 830 and or components 820 can communicate via wireless or wired networks (e.g., Internet). Moreover, the subject invention can be abstracted to include a plant or series of plants with wireless or wired networked equipment whose centers are linked via long distance communications lines or satellites to remote e-commerce, distribution, and shipping locations for dynamic logistics integrated with plant floor control and energy optimization. Thus, energy optimization and/or asset management in connection with the subject invention can be conducted at an enterprise level wherein various business entities as a whole can be sub-components of a larger entity. The subject invention affords for implementation across numerous levels of hierarchies (e.g., individual machines, cluster of machines, process, overall business unit, overall division, parent company, consortiums . . . ).

Figure 9:
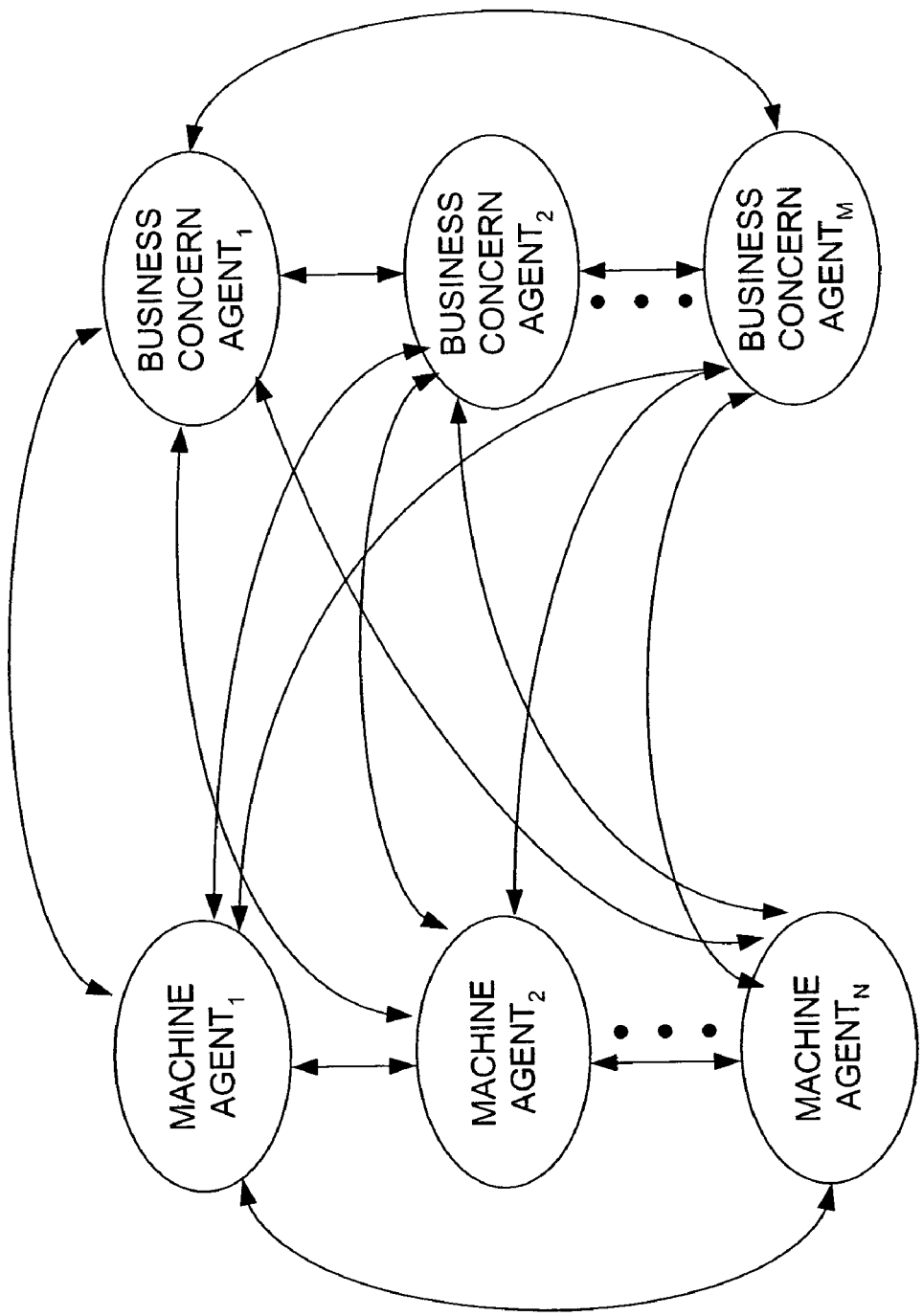
FIG. 9 illustrates an intelligent agent-based framework in accordance with an aspect of the subject invention.

FIG. 9 illustrates an aspect of the subject invention wherein at least a subset of the machines 830 are represented via intelligent software agents. For example, each of the respective machines 310 can be represented by respective intelligent agents (MACHINE AGENT$_1$ through MACHINE AGENT$_N$, N being an integer greater than one), and various business concerns represented by respective agents (e.g. BUSINESS AGENT$_1$ through BUSINESS AGENT$_M$, M being an integer greater than one). The intelligent agents can be software models representative of their various physical or software counterparts, and these agents can serve as proxies for their various counterparts and facilitate execution of various aspects (e.g., machine or load controller interaction, modification, and optimization) of the subject invention. The agents can be designed (e.g., appropriate hooks, common platform, schema, translators, converters . . . ) so as to facilitate easy interaction with other agents. Accordingly, rather than executing an optimization algorithm, for example, on a respective device directly, such algorithms can be first executed on the respective agents and then once the load controllers decide on an appropriate optimization algorithm it can be implemented on the actual devices.

Figure 10:
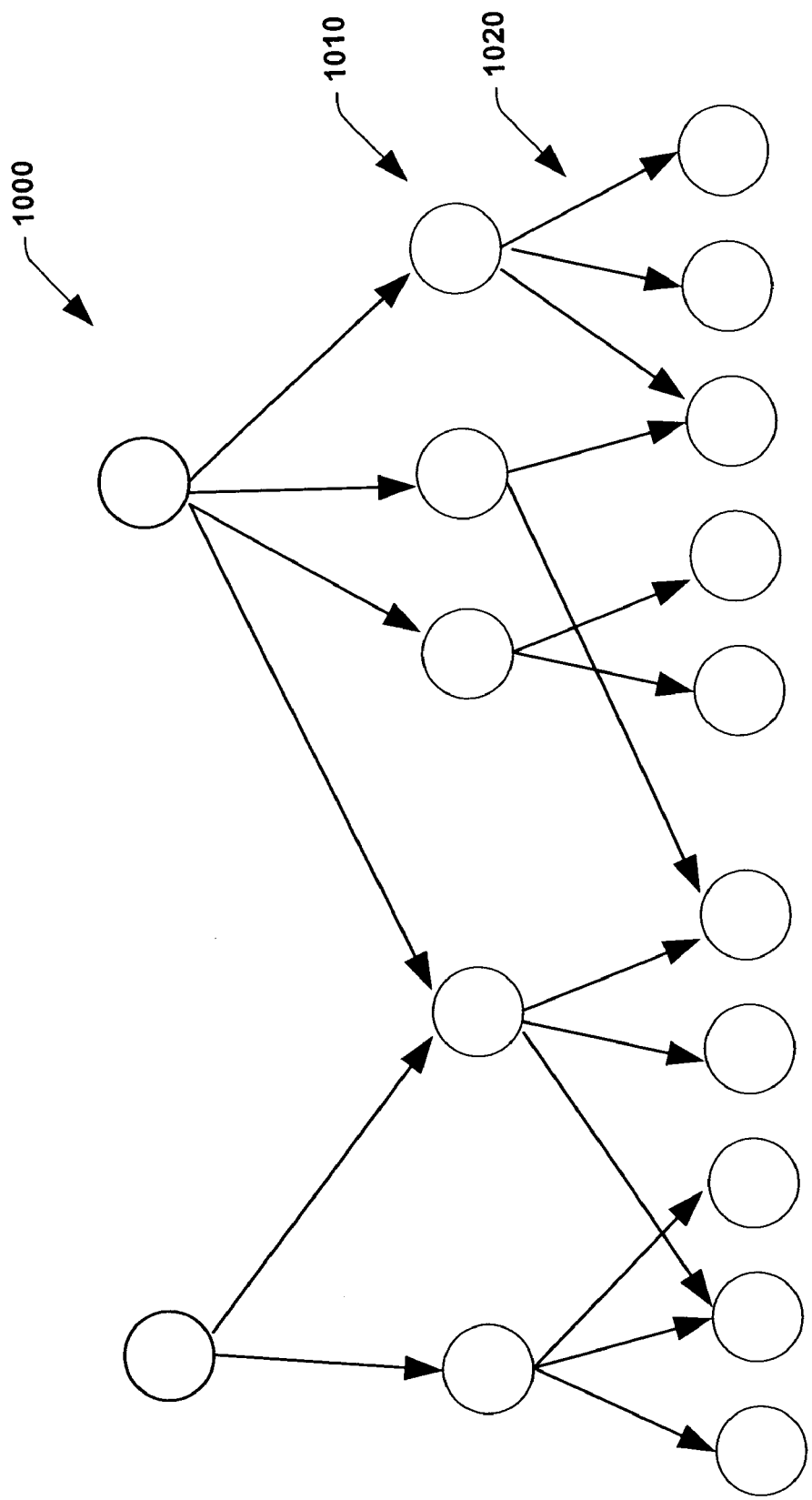
FIG. 10 illustrates an exemplary belief network in accordance with an aspect of the present invention.

FIG. 10 depicts a belief network 1000 that can be used to model uncertainty in a domain in connection with the subject invention. The term "belief networks" as employed herein is intended to encompass a whole range of different but related techniques which deal with reasoning under uncertainty. Both quantitative and qualitative techniques are used (e.g., Bayesian learning methods that perform search over alternative dependency structures and apply a score (such as the Bayesian Information Criteria, etc.) methods, Bayesian classifiers and other statistical classifiers, including decision tree learning methods, support vector machines, linear and non-linear regression, neural network representations . . . ). Influence diagrams are an extension to belief networks; they are used when working with decision making. Belief networks are employed to develop knowledge-based applications in domains characterized by uncertainty (e.g., machine health). A problem domain is modeled as a set of nodes 1010 interconnected with arcs 1020 to form a directed acyclic graph as shown in FIG. 10. Each node represents a random variable or uncertain quantity, which can take two or more possible values. The arcs 1020 signify the existence of direct influences between the linked variables, and the strength of each influence is quantified by a forward conditional probability.

Within the belief network the belief of each node (the node's conditional probability) is calculated based on observable evidence. Various methods have been developed for evaluating node beliefs and for performing probabilistic inference. The various schemes are essentially the same—they provide a mechanism to propagate uncertainty in a belief network, and a formalism to combine evidence to determine the belief in a node. Influence diagrams, which are an extension of belief networks, provide facilities for structuring the goals of load optimization and for ascertaining the value (the influence) given information will have on optimizing system performance. In influence diagrams, there are three types of nodes: chance nodes, which correspond to the nodes in Bayesian belief networks; utility nodes, which represent the utilities of decisions; and decision nodes, which represent decisions which can be taken to influence the state of the world. Influence diagrams are useful in real world applications where there is often a cost, both in terms of time and money, in obtaining information.

An expectation maximization (EM) algorithm is a common approach for learning in belief networks. In its standard form it does not calculate the full posterior probability distribution of the parameters, but rather focuses in on maximum a posteriori parameter values. The EM algorithm works by taking an iterative approach to inference learning. In the first step, called the E step, the EM algorithm performs inference in the belief network for each of the datum in the dataset. This allows the information from the data to be used, and various necessary statistics S to be calculated from the resulting posterior probabilities. Then in the M step, parameters are chosen to maximize the log posterior logP(T|D,S) given these statistics are fixed. The result is a new set of parameters, with the statistics S which we collected are no longer accurate. Hence the E step must be repeated, then the M step and so on. At each stage the EM algorithm guarantees that the posterior probability must increase. Hence it eventually converges to a local maxima of the log posterior.

Figure 11:
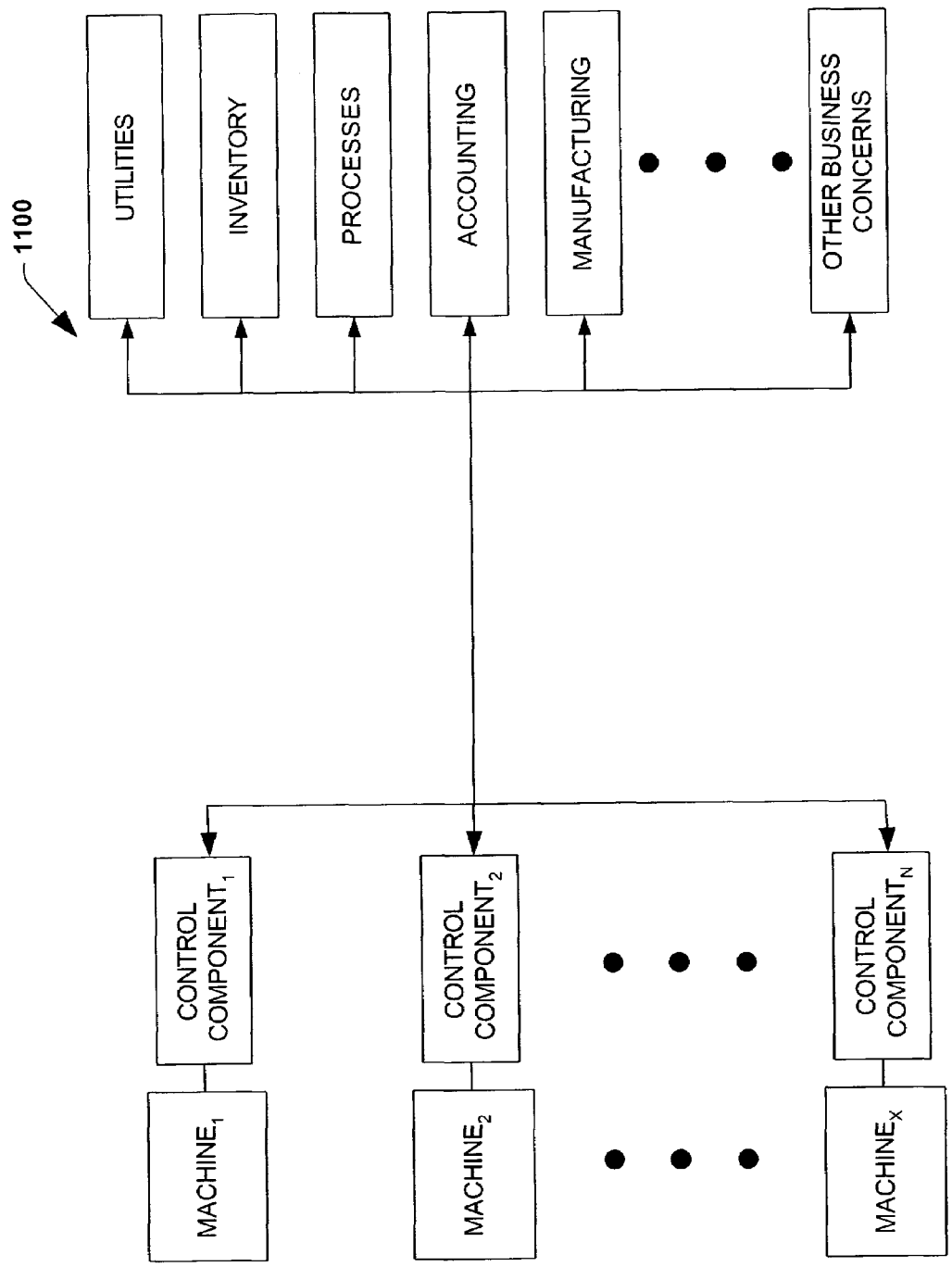
FIG. 11 is a block diagram of a distributed system in accordance with an aspect of the present invention.

FIG. 11 illustrates an aspect of the invention in which the invention is employed as part of a distributed system 1100 rather than via a host computer. Thus, the various components in the system 1100 share processing resources and work in unison and/or in subsets to optimize the overall system 1100 in accordance with various business objectives. It is to be appreciated that such distributed system can employ intelligent agents (FIG. 9) as described supra as well as belief networks (FIG. 10) and the ERP component 810 (FIG. 8). Rather than some of these components (e.g., ERP) being resident on a single dedicated machine or group of machines, they can be distributed among any suitable components within the system 1100. Moreover, depending on which threads on being executed by particular processors and the priority thereof, the components may be executed by a most appropriate processor or set of processors given the state of all respective processors within the system 1100.

Figure 12:
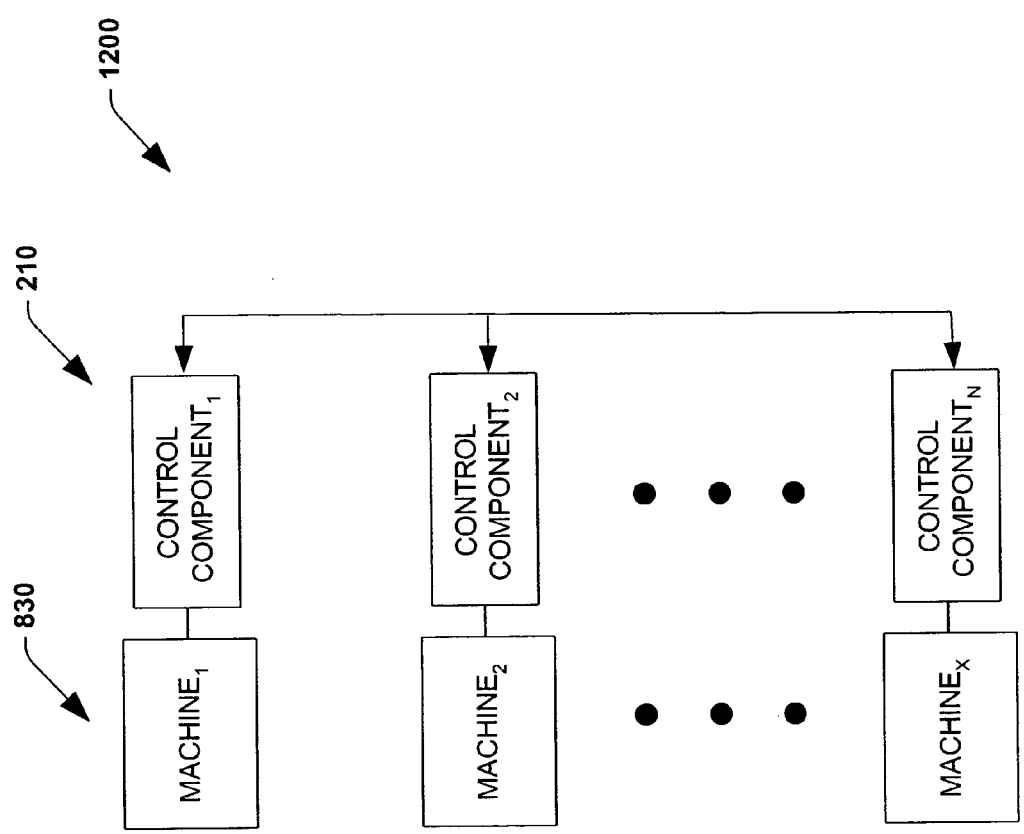
FIG. 12 is a block diagram of a plurality of control modules employing the subject invention.

FIG. 12 illustrates another aspect of the subject invention wherein the invention is implemented among the respective machines 830 in connection with optimizing use thereof. For example, the load control components 210 can exchange and share data so as to, inter alia, load balance and optimize the use of energy.

Returning back to FIG. 8, the present invention can also be employed together with diagnostic and prognostic information to prescribe an optimal control action dynamically. The benefits of integrated diagnostics and control may be significantly expanded by utilizing information describing the rate of degradation and remaining useful life of machinery under various possible operating conditions. This permits changing the operating mode to achieve a designated operating lifetime. Alternatively, the control can be specified to minimize energy consumption and/or maintenance costs or to maximize revenue generation. In extreme conditions the control can be specified to achieve performance beyond the normal operating envelope to protect the environment, avoid costly loses, or protect worker safety while insuring failure will not occur during these extreme operating conditions. Prognosis with control provides the foundation for overall process optimization with regard to objectives such as efficiency, business strategies, maintenance costs, or financial performance.

For example, if a business objective is to minimize the energy cost associated with the cost per gallon of a liquid pumped then changes can be made to the speed of the motor and possibly other drive internal parameters. However, it is significant to note that although this would result in the least energy cost per gallon pumped it may also result in accelerated wear or thermal degradation of critical machinery components. A more comprehensive optimization approach according to the subject invention would be to include diagnostic and prognostic information in optimization algorithms such as expected failure rate and failure cost for different operating modes, machinery lifetime and capital replacement costs, and the impact on other connected machines and processes such as valves, piping, and other process machines.

Figure 13:
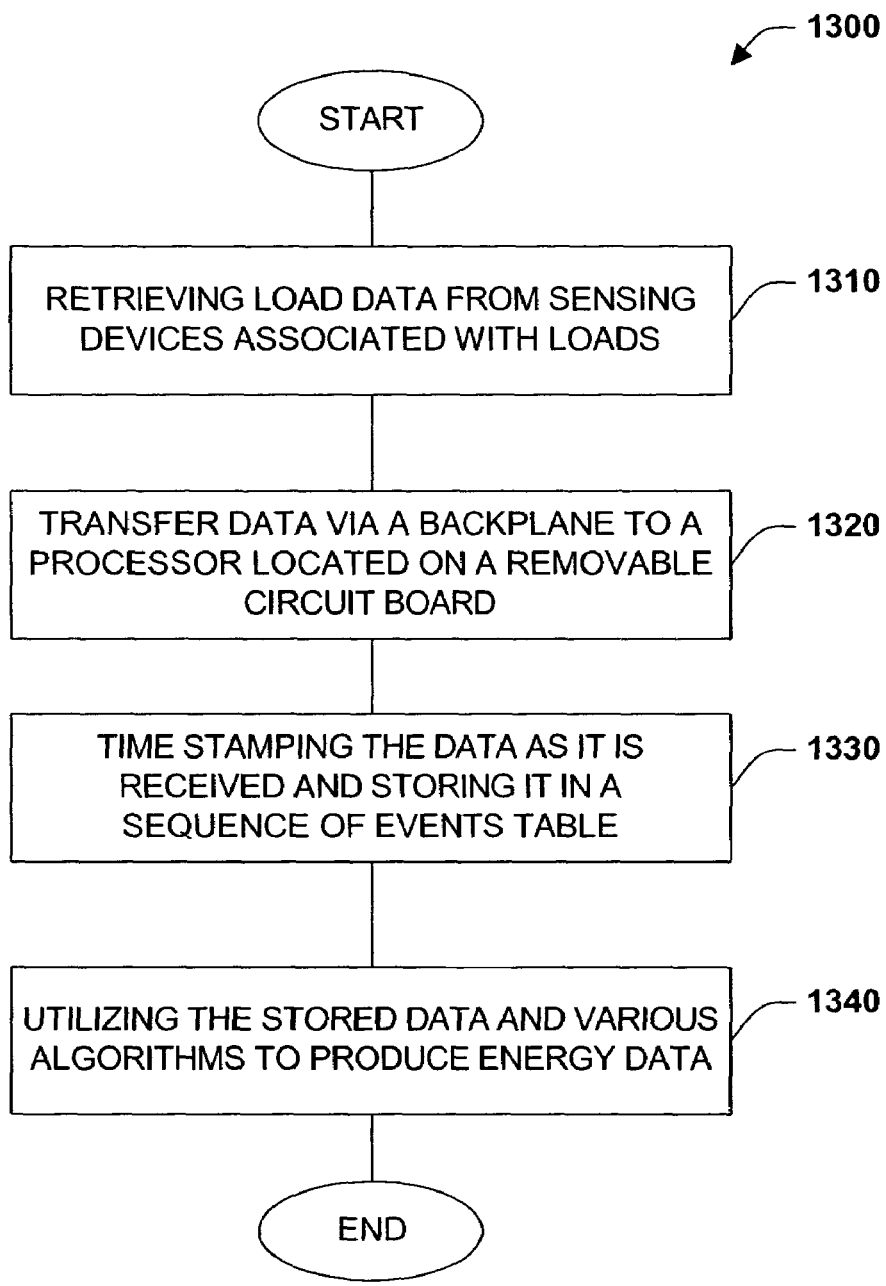
FIG. 13 is a flow chart diagram depicting a load metering methodology in accordance with an aspect of the present invention.
Figure 14:
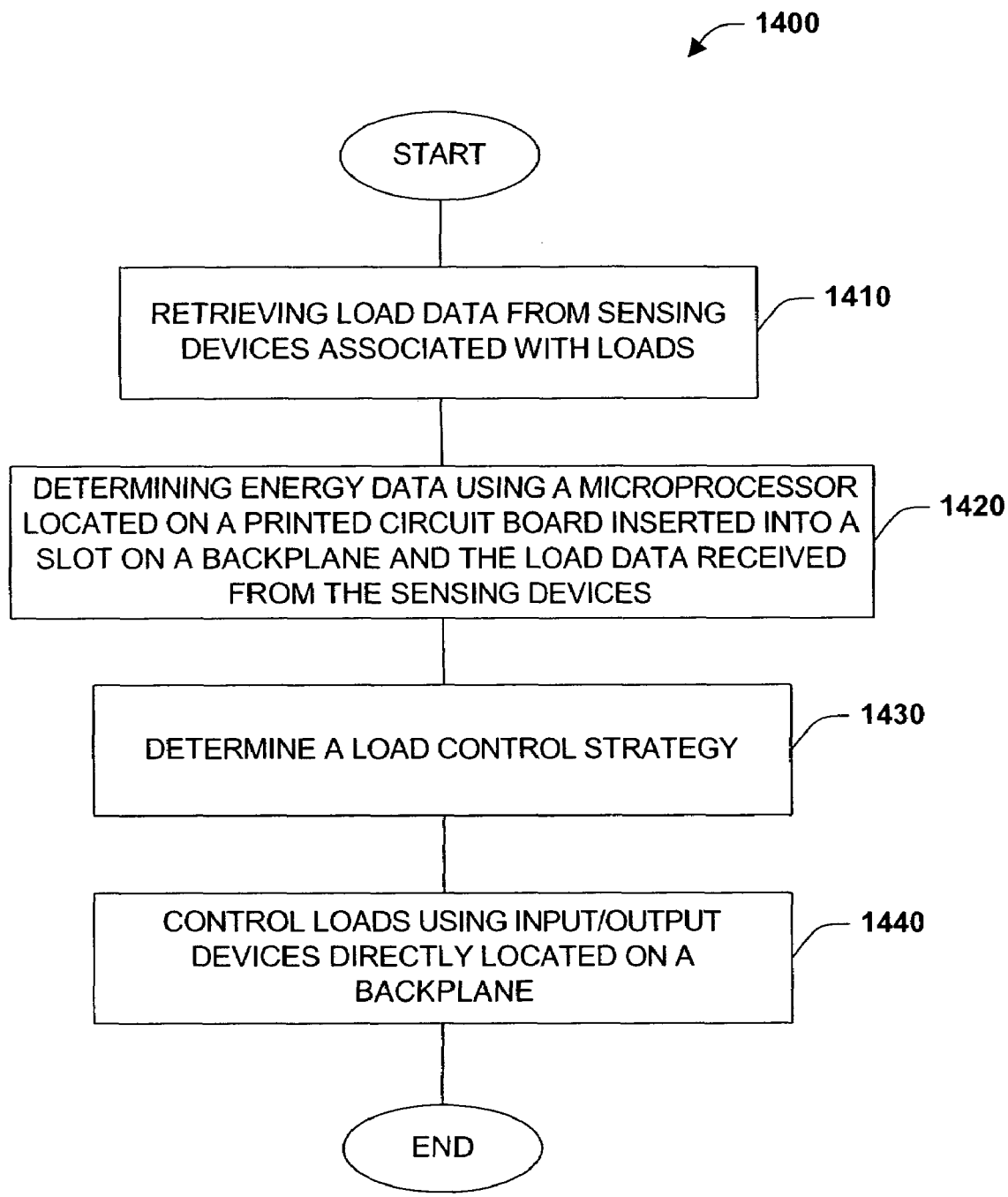
FIG. 14 is a flow chart diagram depicting a methodology associated with controlling a load in accordance with an aspect of the present invention.
Figure 15:
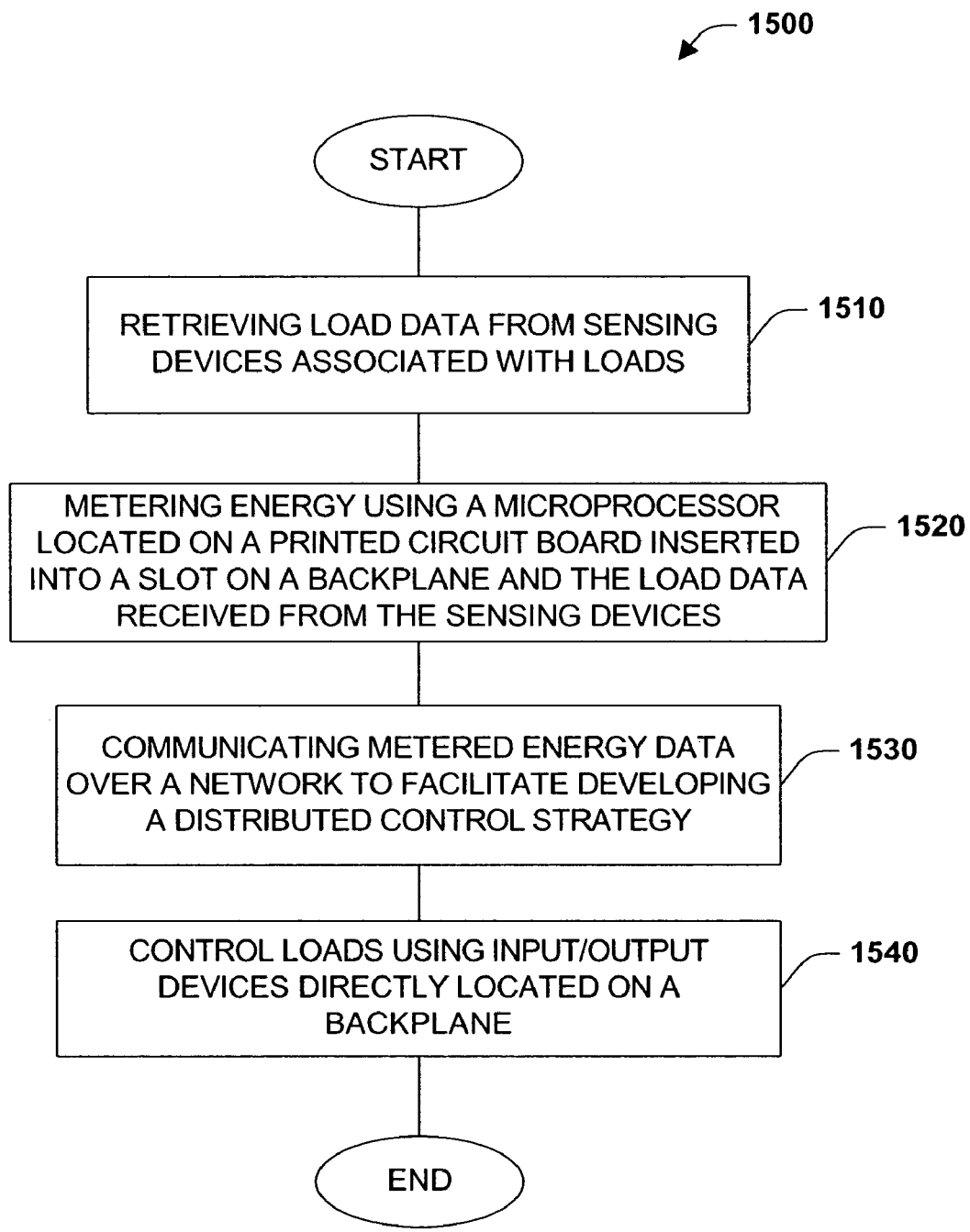
FIG. 15 is a flow chart diagram illustrating a methodology associated with controlling a load according to an aspect of the present invention.

In view of the exemplary systems described supra, a methodology that may be implemented in accordance with the present invention will be better appreciated with reference to the flow charts of FIGS. 13 through 15. While for purposes of simplicity of explanation, the methodology is shown and described as a series of blocks, it is to be understood and appreciated that the present invention is not limited by the order of the blocks, as some blocks may, in accordance with the present invention, occur in different orders and/or concurrently with other blocks from what is depicted and described herein. Moreover, not all illustrated blocks may be required to implement the methodology in accordance with the present invention.

Additionally, it should be further appreciated that the methodologies disclosed hereinafter and throughout this specification are capable of being stored on an article of manufacture to facilitate transporting and transferring such methodologies to computers. The term article of manufacture, as used, is intended to encompass a computer program accessible from any computer-readable device, carrier, or media.

FIG. 13 is a flow chart diagram depicting a methodology 1300 for metering data in accordance with an aspect of the subject invention. At 1310 load data is captured from sensors associated with a machine in real-time. The data can then be transferred via a backplane to a processor on a removable circuit board connected with the backplane, at 1320. Subsequently, at 1330, the load data is time stamped by the processor and stored in memory in a sequence of events table. At 1340, the load data is employed in conjunction with algorithms that produce energy data including but not limited to total energy consumed, harmonic distortion, and power factor associated with the load(s). For example, by utilizing data regarding the sensed voltage and current of the system, the power dissipated by a machine or load can be calculated (P=VI). Thereafter, the processor can utilize the power data and time stamps to determine consumed power (Watts/hr).

Turning to FIG. 14, a methodology 1400 for load control in accordance with an aspect of the present invention is illustrated. At 1410, load data is received from one or more sensors associated with a load. Subsequently, at 1420, energy data (e.g., energy consumption, harmonic distortion, power factor) is determined using a microprocessor on a printed circuit board inserted into a backplane slot and the load data received from one or more sensing devices. At 1430 a load control strategy is determined. The strategy can be based on a plurality of different considerations such as energy conservation, business objectives, and machine health. Next at 1440 the control strategy is implemented by controlling the load using an input/output component located on a backplane.

FIG. 15 is a flow diagram illustrating a methodology 1500 for managing a load in accordance with an aspect of the subject invention. At 1510, load data is received from one or more sensing devices. Then energy is metered employing a microprocessor on a printed circuit board and the load data captured by the sensing devices, at 1520. Next, at 1530, metered data is transferred over a network to facilitate developing distributed control strategy amongst a plurality of loads. Finally, the control strategy is executed by controlling at least one load using an input/output component connected to a backplane, at 1540.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A machine load metering and management system comprising:

a plurality of sensors associated with one or more machines;

a programmable logic controller (PLC) that collects data captured by the plurality of sensors and determines and regulates power to be distributed to one or more machines based at least in part upon metered data generated by a waveform analyzer component utilizing the data captured by the plurality of sensors.

2. The system of claim 1, wherein the waveform analyzer component is a PLC based card.

3. The system of claim 2, wherein the PLC based card is located in a PLC backplane chassis.

4. The system of claim 2, wherein the PLC based card contains a processor and a data storage device.

5. The system of claim 4, wherein the processor time stamps data as it is received and stores the data in a sequence of events table.

6. The system of claim 1, wherein a PLC processor module determines how power is distributed to one or more machines.

7. The system of claim 6, wherein the waveform analyzer component is located inside a PLC processor module.

8. The system of claim 7, wherein the PLC processor module determines how power is distributed based on an optimization algorithm which has input parameters relating to business concerns, the health of each machine, and the power consumed by each machine.

9. The system of claim 7, wherein the PLC processor and the waveform analyzer are connected and communicate via a backplane.

10. A method for monitoring and managing loads comprising:

retrieving load data from one or more sensing devices;

deriving energy data using a microprocessor located on a printed circuit board inserted in a slot on a backplane and the load data received from the sensing devices;

determining a load control strategy based at least in part on the derived energy data; and controlling loads according to the control strategy.

11. The method of claim 10, wherein determining a load control strategy further comprises communicating energy data over a network and collaborating with multiple controllers to develop a distributed control strategy for a plurality of loads.

12. The method of claim 10, wherein load data is restricted to Volts, Amperes and Watts.

13. The method of claim 10, wherein the energy data comprises at least one of energy consumption, harmonic distortion, and power factor associated with a load.

14. The method of claim 10, wherein loads are controlled by output devices connected to the backplane.

15. A computer readable medium having stored thereon computer executable instructions for carrying out the method of claim 10.

* * * * *